United States Patent [19]

Barrs

[11] 4,385,402

[45] May 24, 1983

[54] SWITCHABLE FILTER CIRCUITS

[75] Inventor: Ronald A. Barrs, Crawley, England

[73] Assignee: Redifon Telecommunications Limited, London, England

[21] Appl. No.: 249,973

[22] Filed: Apr. 1, 1981

[30] Foreign Application Priority Data

Apr. 16, 1980 [GB] United Kingdom ................. 8012528

[51] Int. Cl.³ .......................... H04B 1/16; H04B 1/26; H03H 7/01
[52] U.S. Cl. .................................... 455/339; 455/307; 455/314; 333/175; 333/178
[58] Field of Search ............... 455/266, 286, 307, 314, 455/339, 340; 328/167; 333/168, 175, 178; 179/1 D

[56] References Cited

U.S. PATENT DOCUMENTS

| | | | |
|---|---|---|---|
| 2,763,840 | 9/1956 | Pfleger | 328/167 |
| 3,119,067 | 1/1964 | Wohlenberg et al. | 455/314 |
| 3,372,339 | 3/1968 | Harrison et al. | 455/314 |

Primary Examiner—Jin F. Ng

Attorney, Agent, or Firm—Laurence R. Brown

[57] ABSTRACT

A switchable filter circuit for use in a receiver to select a first or a second frequency band from a received signal and for providing predetermined minimum stop band attenuation at frequencies outside the selected frequency band, the second frequency band lying wholly within the first. A first filter element is provided which defines a primary pass band corresponding to the first frequency band, and a second filter element is provided which defines a secondary pass band corresponding to the second frequency band, the first filter element having an input to which the received signal is applied, and the second filter element have an input for receiving the output of the first filter element. The stop band attenuation of the first filter element is at least as great as the predetermined minimum stop band attenuation required, and the stop band attenuation of the secondary filter element within the primary pass band being that which is required by the application. Thus the first filter element significantly determines the stop band characteristics of the filter circuit as a whole outside the primary pass band.

4 Claims, 12 Drawing Figures

SWITCHABLE FILTER CIRCUITS

The present invention relates to switchable filter circuits, and in particular to switchable filter circuits for selecting a first or a second frequency band from a received signal and for providing a predetermined minimum stop band attenuation at frequencies outside the selected frequency band.

In general purpose receivers as used for example in HF communications systems, the signal selectivity characteristics are usually defined by means of a crystal or mechanical filter at intermediate frequency. Such a receiver generally has to provide more than one type of selectivity, for example:

+250 to +300 Hz upper side band (USB)
−250 to −3000 Hz lower side band (LSB)
±15,000 Hz
±500 Hz all with respect to 1.4 MHz.

In such a receiver, filters corresponding to the various selectivity types are normally provided in parallel. Any one of these parallel filters can be switched into the signal path as required. Each filter has to define a respective pass band, and has to provide appropriate stop band attenuation. Thus each filter requires components to define its stop band characteristics as well as components to define its pass band characteristics. A satisfactory stop band performance is relatively difficult to achieve and this often entails in a crystal filter for example the use of as many or more filter elements to define acceptable stop band attenuation characteristics as are required to define the pass band.

Essentially a receiver filter designer is presented with a specification defining the pass bands which it is desired to select and the minimum stop band attenuation which must be provided outside whichever pass band is selected. Obviously an ideal pass band filter would have a U-shaped attenuation versus frequency characteristic having a flat low attenuation "nose" extending across the pass band and vertical sides indicating a very rapid increase in attenuation as the frequency moves outside the pass band. In practice the specified minimum stop band attenuation is a compromise between desired receiver quality and cost. Whatever the specification however, filter designers have in the past built parallel filters each defining a respective pass band and adjacent stop bands, only one of the parallel filters being switched into circuit at any one time.

It is of course well known to provide a so-called roofing filter at the input to a switchable filter circuit which roofing filter is effectively connected in series with the selected one filter element in the filter circuit. Such a roofing filter does not however make a significant contribution to the stop band characteristics of the filter elements as it has a very shallow attenuation/frequency characteristic.

Surprisingly, it has been discovered that high selectivities can be obtained in receiver filter circuits by replacing the parallel-arranged filter elements by a cascade of series connected filter elements and relying upon the first filter element in the cascade to define substantially all the stop band attenuation outside its own pass band.

Accordingly the present invention provides a switchable filter circuit for selecting a first or a second frequency band from a receiver signal and for providing predetermined minimum stop band attenuation at frequencies outside the selected frequency band, wherein the second frequency band lies wholly within the first, comprising a first filter element defining a primary pass band corresponding to the first frequency band, a second filter element defining a secondary pass band corresponding to the second frequency band, and switching means for connecting an output of the filter circuit to the output of the first and second filter elements, characterised in that the first filter element comprises an input to which the received signal is applied, and the second filter element comprises an input for receiving the output of the first filter element, the stop band attenuation of the first filter element being at least as great as said predetermined minimum stop band attenuation, and the stop band attenuation of the secondary filter element within the primary pass band being that which is required for the application, whereby the first filter element significantly determines the stop band characteristics of the filter circuit as a whole outside the primary pass band.

Preferably three filter elements are provided, the third element having an input for receiving the output of the second filter element.

Preferably the filter circuit is connected in a receiver between an input mixer and an output mixer, the input mixer receiving an input signal (from for example an aerial) and the output of a frequency synthesizer and providing an output to the filter circuit, and the output mixer receiving the output of the filter circuit and the output of a variable divide and providing an AF output, the frequency synthesizer and variable divider receiving the output of a local master oscillator. A service select module controls the frequency synthesizer and variable divider such that the reinsertion carrier provided by the variable divider and the output of the frequency synthesizer may be shifted in frequency to enable selection of upper and lower side bands on the same nominal carrier frequency.

An embodiment of the present invention will now be described, by way of example, with reference to the accompanying drawings, in which.

Figure 1:
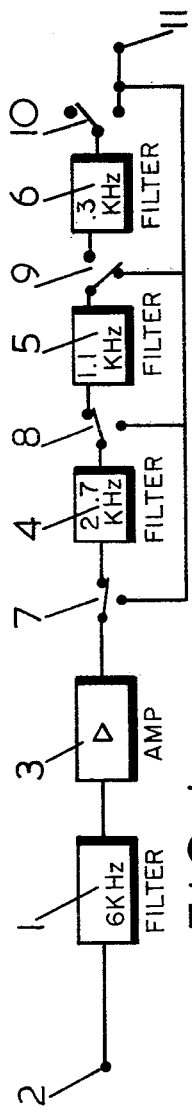
FIG. 1 is a block diagram of a filter circuit in accordance with the invention.

Referring to FIG. 1, the illustrated embodiment of the invention comprises a 6 kHz filter 1 connected to input 2, an amplifier 3, and first, second and third filter elements 4, 5 and 6 respectively. Filter element 4 is a symmetrical 2.7 kHz filter normally used for sideband selection, filter element 5 is a 1.1 kHz filter normally used for frequency shift signal selection as in teletype transmissions for example, for the filter element 6 is a 0.325 kHz filter normally used for the reception of keyed telegraphy transmissions. Switches 7, 8, 9 and 10 make it possible to selectively apply the output of any one of the filter elements to a filter circuit output 11.

The amplifier 3 is provided to compensate for the cumulative losses in the signal path. It may be however that in some circumstances these losses are relatively small, and if this is the case the amplifier 3 may be omitted.

The switching arrangement shown is preferred as filter elements not in use are isolated from the signal path. It will be appreciated however that alternative switching arrangements could be adopted if desired.

Figure 2:
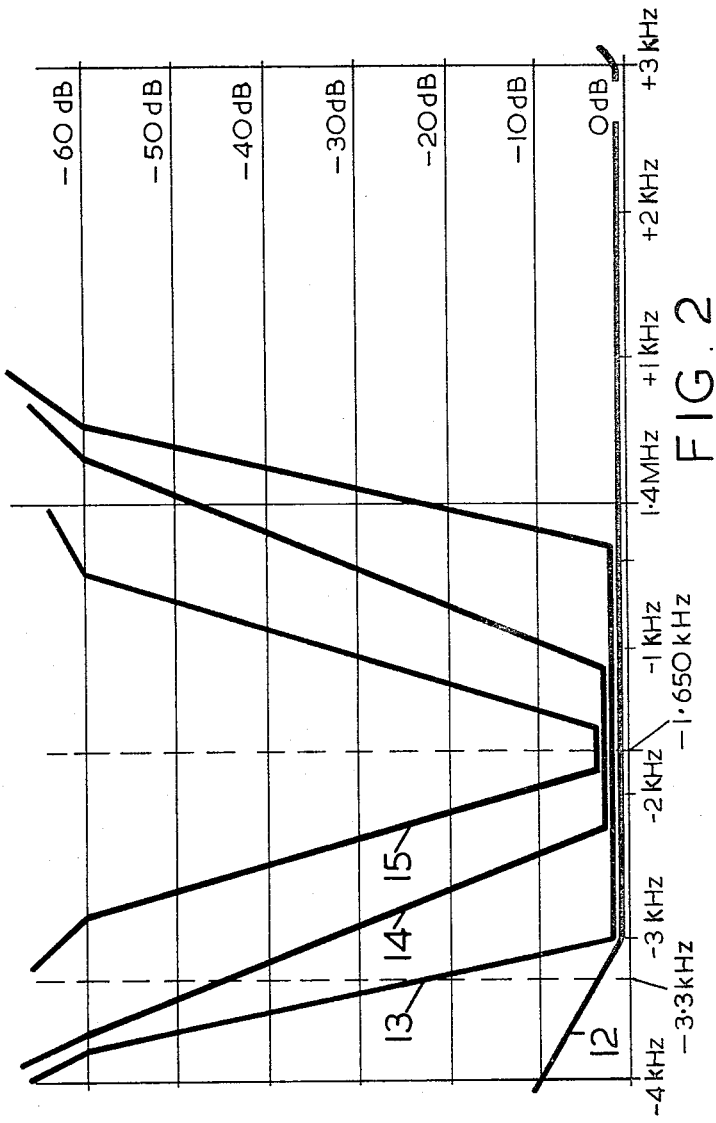
FIG. 2 is an idealized illustration of selectivity curves obtainable with a filter circuit as described with reference to FIG. 1.

FIG. 2 shows idealised attenuation versus frequency characteristics for the filter circuit of FIG. 1. The shallow selectivity of filter 1 is shown by curve 12, the selectivity resulting from filter 1 and filter element 4 by curve 13, the selectivity resulting from filter 1 and filter elements 4 and 5 by curve 14, and the selectivity resulting from filter 1 and filter elements 4, 5 and 6 by curve 15.

The pass band of the set of filters taken together is common to the pass band of each individual filter and therefore the impedances of each filter element over that pass band are matched one to the other.

Figure 3:
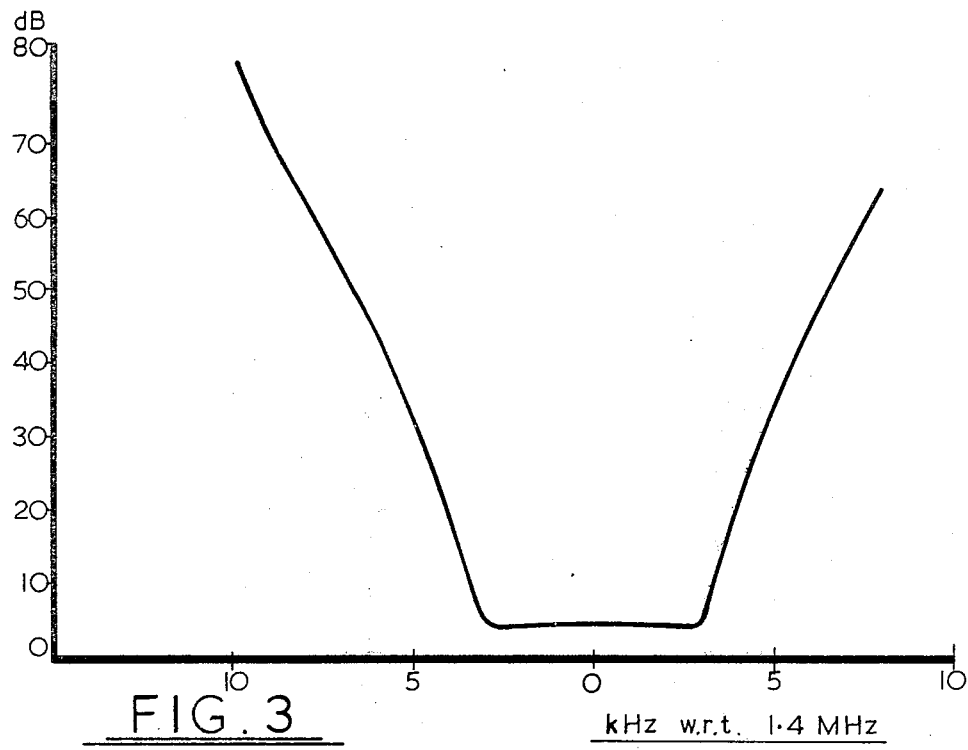
FIGS. 3 to 7 illustrate actual selectivity curves obtained using practical circuits as described with reference to FIG. 1.
Figure 4:
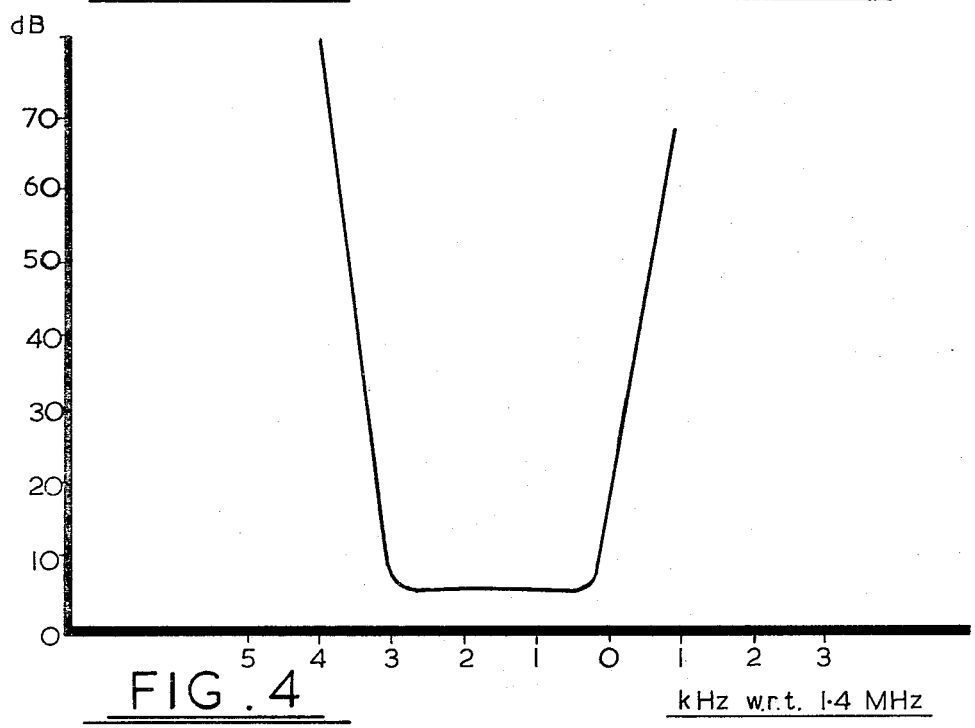
Figure 5:
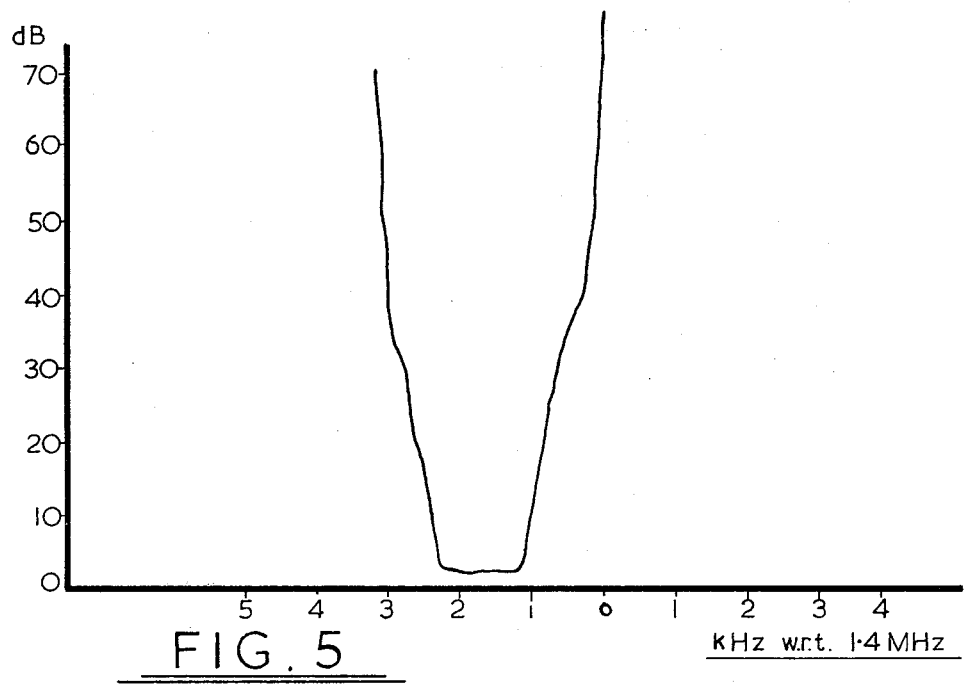
Figure 6:
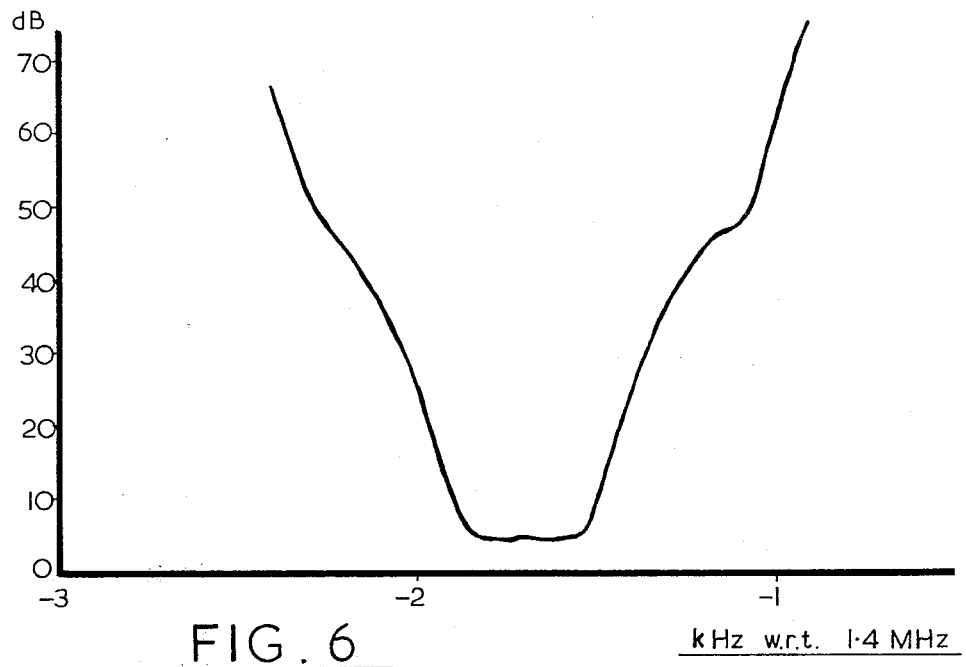
Figure 7:
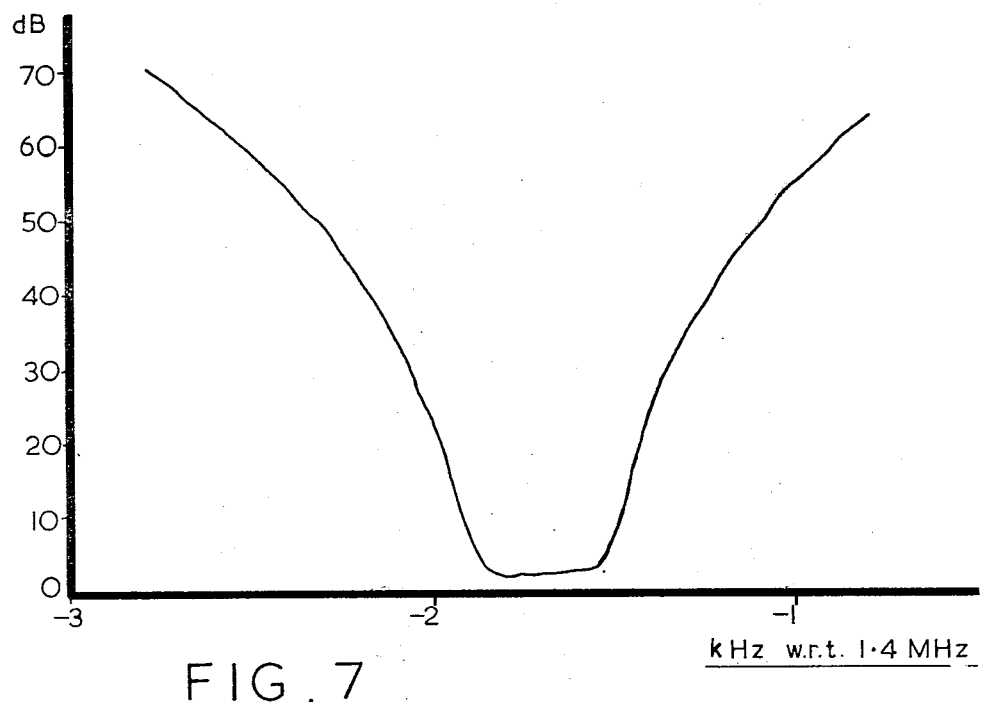
Figure 8:
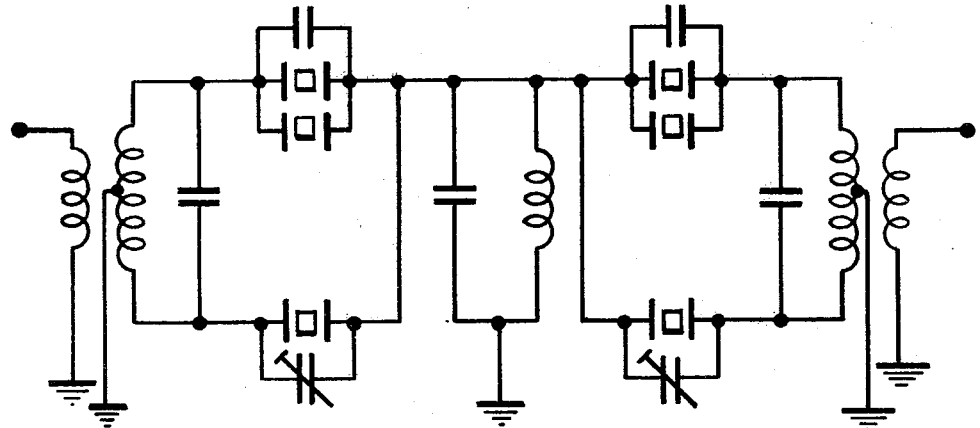
FIGS. 8 to 11 are schematic circuit diagrams of filter elements of a filter circuit as described with reference to FIG. 1 and providing the selectivity curves of FIGS. 3 to 7.

FIGS. 3 to 7 show experimentally obtained attenuation versus frequency curves for a practical filter circuit of the type described in outline with reference to FIG. 1. FIG. 3 shows the response of the 6 kHz filter 1, FIG. 4 shows the response at the output of the 2.7 kHz filter element 4, FIG. 5 shows the response at the output of the 1.1 kHz filter element 5, and FIG. 6 shows the response of the 0.325 kHz filter element 6. FIG. 7 shows the response of the 0.325 kHz filter element 6 on its own. It will be seen from comparing the curves of FIGS. 6 and 7 that although the curves are very similar in the pass band and closely adjacent thereto, the reducing rate of increase of attenuation at frequencies progressively more distant from the pass band apparent in FIG. 6 contrasts with the equivalent portions of FIG. 7 where the attenuation due to the preceding filter sections in the cascade show their effects. Thus although the "nose" section of the response curve of each filter section must be carefully defined, the sides of the curves of the two downstream filter elements 5 and 6 can drift appreciably as the filter section 4 effectively determines the stop band characteristics of the filter circuit as a whole except within its own relatively narrow pass band.

FIGS. 8, 9, 10 and 11 respectively show circuit diagrams for the filter elements 1, 4, 5 and 6 of FIG. 1, the illustrated circuits providing the responses of FIGS. 3 to 7. Each circuit receives input signals at its left-hand terminal and provides output signals at its right-hand terminal as shown in the drawings. The circuits use conventional crystal filter components and techniques and are therefore not described in detail.

As is well known, crystal components of crystal filters have spurious gaps in their individual attenuation characteristics and it is important to ensure that in a multi-crystal filter these spurious effects are suppressed by carefully overlapping the attenuation characteristics of associated crystal components to avoid coincidence of these spurious gaps. All the crystals have slightly different resonant frequencies and their resonant frequencies are staggered relative to each other so that gaps in the stop band of one crystal fall on the effective stop bands of the other crystals. The selection of crystals to meet specified attenuation versus frequency characteristics is generally achieved by standard computer programmes well known to persons skilled in the field of crystal filters.

Figure 9:
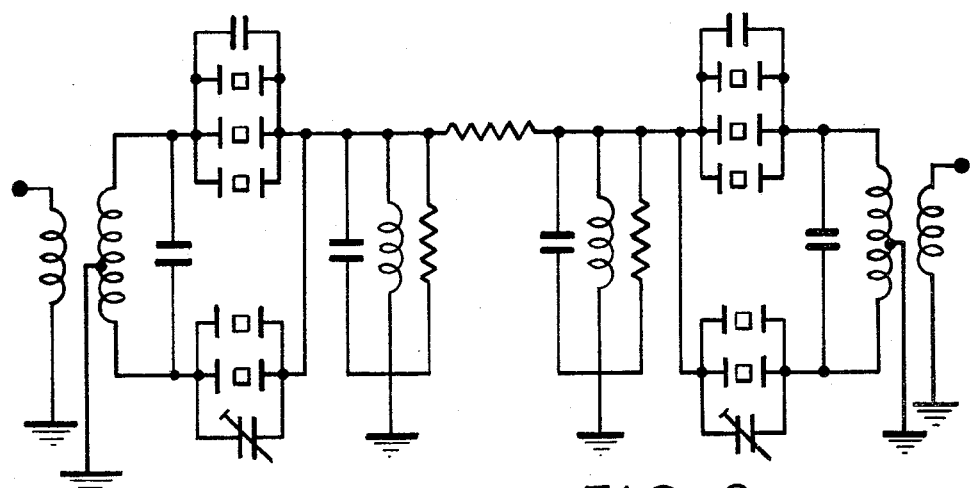
Figure 10:
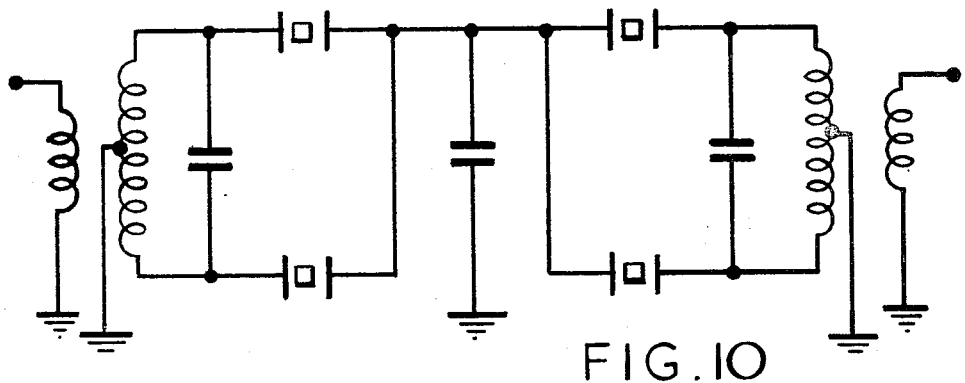
Figure 11:
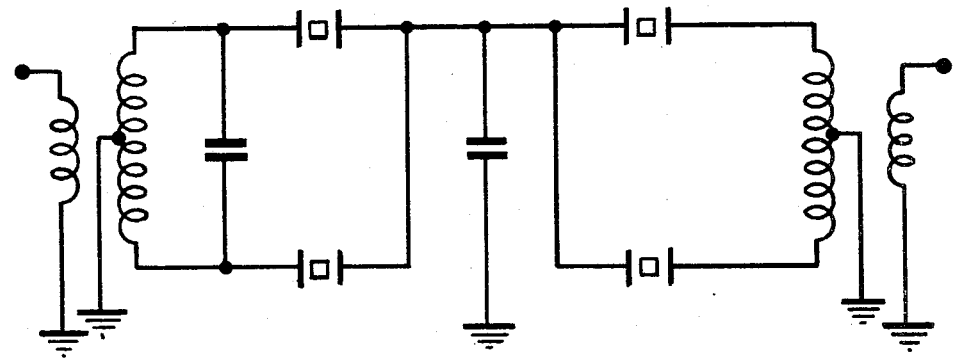

It will be noted from FIG. 9 that the 2.7 kHz filter, which determines the stop band attenuation (outside its own pass band) for the filter circuit as a whole, is relatively complex, requiring ten crystals. This complexity is necessary to provide the flat "nose" and steep sides of the response curve of FIG. 4. In contrast, the 1.1 kHz and 0.325 kHz filters of FIGS. 10 and 11 are relatively simple, requiring only four crystals each. If, as in conventional receiver filter circuits, each of the filters of FIGS. 10 and 11 had to include components to determine their stop band attenuations over a wide frequency range, the total component and assembly costs could be significantly higher if equivalent performance was to be obtained.

Figure 12:
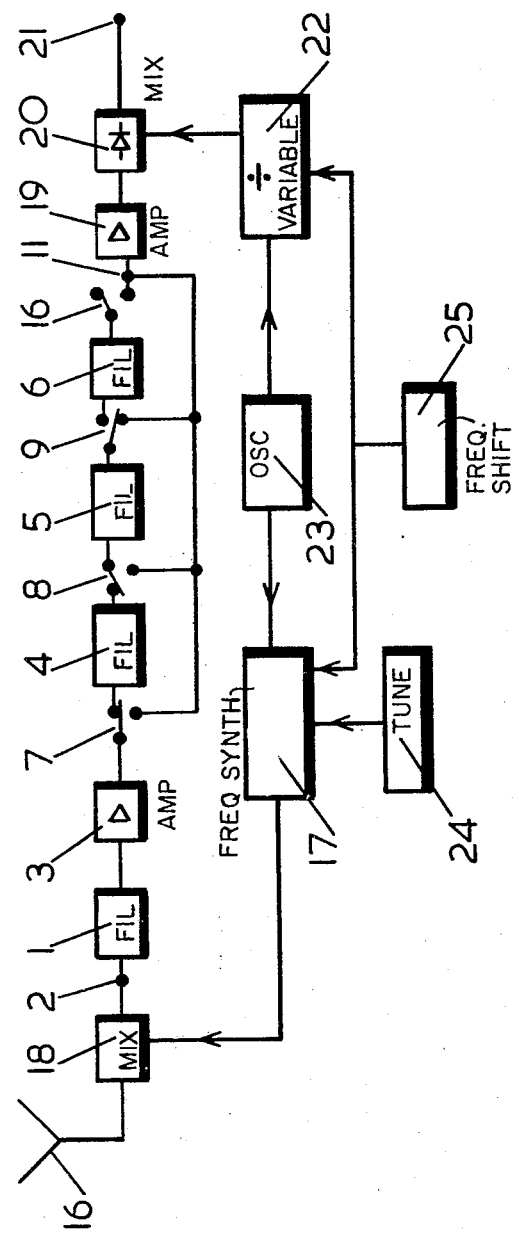
FIG. 12 is a block diagram of a receiver circuit incorporating the circuit of FIG. 1 and capable of selecting upper and lower sidebands from one of the filter sections described with reference to FIG. 1.

Referring now to FIG. 12, a receiver incorporating the filter circuit of FIG. 1 is illustrated schematically. Signals received from an aerial 16 are mixed with the output of a frequency synthesizer 17 in a mixer 18 and applied to input 2 of the filter circuit of FIG. 1. The output 11 of the filter circuit is connected via amplifier 19 and mixer 20 to an AF output terminal 21. The mixer 20 also receives the output of a variable divider 22. The variable divider 22 and frequency synthesizer 17 receive fundamental frequency inputs from a local stable master oscillator 23. A tuning control unit 24 controls the output frequency of the synthesizer 17 and hence the tuning of the receiver as a whole.

Referring to FIG. 2, when the filter circuit is arranged to operate in a symmetrical mode with respect to the designated frequency for bandwidths of 2.7 kHz or lower, a centre frequency of $-1.65$ kHz with respect to 1.4 MHz is used. The centre frequency may however be moved to 0 or $-3.3$ kHz with respect to 1.4 MHz to provide LSB and USB operation with varying bandwidths as required. This is achieved by a service select module 25 which is effective to shift the frequencies of the outputs of the synthesizer 17 and variable divider 22 as appropriate. This avoids the need for discrete upper and lower side band filter elements in the filter circuit.

In contrast to the embodiment described with respect to FIG. 12, the demodulator 20 may have applied to it a re-insertion carrier derived from a crystal oscillator the frequency of which may be switched to provide the required frequencies. The variable divider 22 would not be provided in such an arrangement.

What is claimed is:

1. A switchable filter circuit for selecting a first and a second frequency pass band from a received signal and for providing predetermined minimum stop band attenuation at frequencies outside the selected frequency band, wherein the second frequency band lies wholly within the first, comprising a first filter element defining a primary pass band corresponding to the first frequency band, a second filter element defining a secondary pass band corresponding to the second frequency band, an output to the filter circuit, and switching means for connecting the output of the filter circuit selectively to the outputs of the first and second filter elements, characterised in that the first filter element comprises an input to which the received signal is applied, and the second filter element comprises an input for receiving the output of the first filter element, means providing stop band attenuation of the first filter element at least as great as said predetermined minimum stop band attenuation, and filter construction providing little additional stop band attenuation in the second filter element whereby the first filter element significantly determines the stop band characteristics of the filter circuit as a whole outside the primary pass band and the second filter requires fewer filter components than the first filter.

2. A filter circuit according to claim 1, coupled to process signals of a receiver wherein the filter circuit is connected in a receiver between an input mixer and an output mixer, means providing the input mixer with a receiving input signal and the output of a frequency synthesizer, and means coupling the output mixer for receiving the output of the filter circuit and an output of a variable divider to provide therefrom an AF output, means coupling the frequency synthesizer and variable divider for receiving the output of a local master oscillator, and a service select module provided for controlling the frequency synthesizer and the variable divider to shift in frequency the output of the variable divider and the output of the frequency synthesizer whereby upper or lower sideband reception on the same nominal carrier frequency may be effected utilizing the passband response of a single filter.

3. A filter circuit as defined in claim 1 wherein filtering elements consist of crystal filters.

4. A filter circuit as defined in claim 3 having multiple crystal filters with the resonant frequencies of different crystal components in said filters staggered relative to each other so that the gaps in the stop band of one crystal fall on the effective stop bands of another crystal.

* * * * *